(12) United States Patent
He et al.

(10) Patent No.: US 6,710,541 B2
(45) Date of Patent: Mar. 23, 2004

(54) POLARIZED LIGHT SOURCES AND METHODS FOR MAKING THE SAME

(75) Inventors: Zhan He, Bedford Hills, NY (US); Sadeg M. Faris, Elmsford, NY (US)

(73) Assignee: Reveo, Inc., Elmsford, NY (US)

( * ) Notice: Subject to any disclaimer, the term of this patent is extended or adjusted under 35 U.S.C. 154(b) by 80 days.

(21) Appl. No.: 09/747,564

(22) Filed: Dec. 22, 2000

(65) Prior Publication Data

US 2002/0079831 A1 Jun. 27, 2002

(51) Int. Cl.[7] .................................................. H01J 1/62
(52) U.S. Cl. ..................... 313/504; 313/506; 315/169.1
(58) Field of Search ............................. 315/219, 169.1, 315/169.3; 313/461, 506, 509, 511, 521, 504; 257/693, 698; 438/106

(56) References Cited

U.S. PATENT DOCUMENTS

| | | | | |
|---|---|---|---|---|
| 5,096,520 | A | 3/1992 | Faris | 156/99 |
| 5,394,253 | A | 2/1995 | Kelly | 359/15 |
| 5,796,509 | A | 8/1998 | Doany et al. | 359/254 |
| 5,831,375 | A | 11/1998 | Benson, Jr. | 313/110 |
| 5,928,801 | A | 7/1999 | Broer et al. | 428/690 |
| 5,932,965 | A | * 8/1999 | Berggen et al. | 313/506 |
| 6,034,753 | A | 3/2000 | Li et al. | 349/98 |
| 6,101,032 | A | 8/2000 | Wortman et al. | 359/500 |
| 6,218,774 | B1 | * 4/2001 | Pope | 313/461 |
| 6,507,379 | B1 | * 1/2003 | Yokoyama et al. | 349/69 |
| 6,590,346 | B1 | * 7/2003 | Hadley et al. | 315/169.3 |
| 6,606,247 | B2 | * 8/2003 | Credelle et al. | 361/737 |

FOREIGN PATENT DOCUMENTS

| | | | |
|---|---|---|---|
| EP | 0838715 | 4/1998 | G02F/1/1335 |
| GB | 2320105 | 6/1998 | G02F/1/21 |
| JP | 10282494 | 10/1998 | G02F/1/1335 |
| WO | WO0151984 | 7/2001 | G02F/1/133 |

OTHER PUBLICATIONS

Sharply Directed Emission in Organic Electroluminescent Diodes with an optical–Microcavity Structure, by Tsutsui et al., American Institute of Physics, vol. 65, No. 15, 1994, p. 1868–1870.

International Search Report, PCT/US01/50314, mailed Nov. 7, 2002.

* cited by examiner

Primary Examiner—Don Wong
Assistant Examiner—Jimmy T. Vu
(74) Attorney, Agent, or Firm—Gerow D. Brill, Esq.; Ralph J. Crispino, Esq.

(57) ABSTRACT

The disclosed invention is a novel polarized light source. The polarized light source of this invention includes an organic electroluminescent (OEL) device or an organic photoluminescent (PL) device and a cholesteric liquid crystal (CLC) polarizing device. The polarized light source of the present invention is an efficient, high purity, and bright source of polarized light. Further, the present invention enables a polarized light source to be custom designed with a polarization bandwidth and position across a wide range of wavelengths. Further still, the light source of this invention is made from low cost materials and is easily manufactured. Yet further still, this invention enables the production of ultra-thin and lightweight polarized light sources.

44 Claims, 10 Drawing Sheets

POLARIZED LIGHT SOURCES AND METHODS FOR MAKING THE SAME

BACKGROUND OF THE INVENTION

1) Field of the Invention

The present invention relates to polarized light sources. More specifically this invention relates to polarized light sources with pre-selected bandwidths and several methods for making the same.

2) Background Information

The use of polarized light has become ubiquitous in modem technology, functioning as both a direct improvement for some applications and an enabling technology for others. For example, polarized indoor lighting may dramatically reduce glare from horizontal surfaces, reducing eyestrain and lowering power requirements by eliminating the unnecessary polarization components. Further, most liquid crystal display (LCD) panels used in wristwatches, notebook computers, and automobile dashboard displays require polarized light. Polarized light is usually obtained with the use of polarizing sheets or films that absorb over 50% of the incident light. Therefore, a device that contains an LCD operates at considerably less than optimal efficiency, wasting energy and therefore shortening battery life.

A light source that produces substantially pure polarized light would be a significant improvement over the use of polarizing sheets and films. Such a device may deliver a dramatic improvement to LCD and interior lighting performance, as well as play a key role in reducing glare in numerous situations. Reducing glare is important to reducing energy consumption and improving consumer safety.

The simplest way to produce polarized light is to place a polarizer over a conventional, unpolarized light source, thereby extinguishing one of the two polarization components. As described above, conventional polarizers absorb at least 50% of the incident light in order to transmit the desired polarization component, and therefore generally cannot be used to produce bright, efficient polarized light sources. One improved technology is to utilize polarization converters based on integrated polarizing beam splitters as described by Faris, in U.S. Pat. No. 5,096,520, and Kelly, in U.S. Pat. No. 5,394,253. However, such polarizing beam splitter sheets may be relatively bulky and heavy, and tend to be difficult to implement in applications requiring flat configurations. An alternative approach is the use of multiple polymer dielectric-layer (MPDL) based polarizers. These are described by Benson (in U.S. Pat. No. 5,831,375), Weber, et al., (in Science, vol. 287, p. 2451 (2000)), and Wortman, et al., (in U.S. Pat. No. 6,101,032). These Benson and Wortman patents are fully incorporated by reference herein. The MPDL based polarizers are constructed of multiple birefringence layers that are designed to reflect the desired polarization component and transmit the other. They, therefore, absorb very little light. Both Benson and Wortman, et al., disclose the use of MPDL based polarizers to construct polarized light sources. However, it is expected that difficulties would be encountered in manufacturing because precise control of the thickness and birefringence value is required for each layer. The manufacturing difficulties would be exacerbated for a broadband polarizer because thickness variation would be required in the different layers.

Recently, a number of researchers have reported the emission of polarized light from organic electroluminescent (OEL) and/or photoluminescent (PL) devices. For example, see Dyreklev, et al., in Adv. Mater., vol. 7, p. 43 (1995), Era, et al., in Appl. Phys. Lett., vol. 67, p. 2436 (1995), Cimrova, et al., in Adv. Mater., vol. 8, p. 146 (1996), Sariciftci, et al., in Adv. Mater., vol. 8, p. 651 (1996), and Montali, et al., in Nature, vol. 392, p. 261 (1998). These researchers concentrated on aligning organic molecules in a configuration such that polarized light emission was achieved. For example, Era et al., used epitaxial growth of organic materials on ordered films or rubbed films to obtain molecular alignment of the emitting materials, resulting in emission of linearly polarized light. However, as is typical for these methods, highly specific and costly materials, and a complicated vacuum deposition process are required. Manufacturing of multiple devices or of large-area devices would be prohibitively expensive and impractical using these methods.

A further method has been disclosed, whereby π-conjugated polymers are utilized to obtain emission of circularly polarized light (Peeters, et al., J. Am. Chem. Soc., vol. 119, p. 9909 (1997)). However, the polarization purity achieved was poor, resulting in only a fraction of a percent more light of one handedness than the other. Polarization purity was also the primary drawback of a recent grating-based technique reported by Suganuma in Appl. Phys. Lett., vol. 74, p. 1206 (1999).

The most promising processes reported to date rely on the self-assembling nature of cholesteric liquid crystal (CLC) molecules. Lussem, et al., in Liq. Cryst., vol. 21, p. 903 (1996), developed a light-emitting liquid crystalline polymer that was spin-coated on a rubbed polyimide surface to achieve alignment of the liquid crystal molecules. The light emissions were linearly polarized, however, the light-emitting polymer material is quite rare and expensive, thereby limiting the practicality of this method. Chen, et al., in Nature, vol, 397, p. 506 (1999), reported polarized light emission from a photoluminescent device using glassy chiral-nematic liquid crystal films. They observed strongly circularly polarized light emission in the reflective bands of these liquid crystals within the 400–420 nm wavelength range, and crossover between intensities of right-handed (RH) and left-handed (LH) circularly polarized light within these bands. These circularly polarized light devices have two serious disadvantages, however. First, since the polarized light emission only appears in the reflective band (as expected for a CLC polarizing device), broadband polarized light emission cannot be achieved. Second, the crossover behavior between RH and LH polarized light renders the materials generally unsuitable for display applications.

In conclusion, there are currently no low-cost methods for producing an efficient polarized light source that provides high purity polarized light.

SUMMARY OF THE INVENTION

The present invention is a novel polarized light source. The polarized light source of this invention includes an organic electroluminescent (OEL) device or an organic photoluminescent (OPL) device and a non-absorbing cholesteric liquid crystal (CLC) polarizing layer.

The polarized light source of the present invention is a highly efficient, high purity, and bright source of polarized light. The theoretical maximum light efficiency for this invention is 100%. Further, the present invention enables a polarized light source to be custom designed with a polarization bandwidth and position across a wide range of wavelengths. Further still, the light source of this invention is made from low cost materials and is easily manufactured. Yet further still, this invention enables the production of ultra-thin and lightweight polarized light sources.

In one embodiment, the present invention is a polarized light source comprising (i) an OEL device that includes a anode, an OEL material, and an indium tin oxide glass substrate anode or an OPL device that includes a mirror and an OPL material, (ii) a CLC polarizing device, and (iii) one or more glass substrates. This embodiment produces substantially pure circularly polarized light in the reflection bandwidth of the CLC polarizing device and unpolarized light at other wavelengths.

In another embodiment, the present invention is a polarized light source comprising (i) an OEL or OPL device as described in the previous embodiment, (ii) a CLC polarizing device, and (iii) a micro cavity capable of generating micro cavity resonance. The polarized light source of this embodiment may further comprise a birefringent retarder layer, positioned within the micro cavity. The birefringence value or the thickness of the birefringent retarder layer may be chosen such that the micro cavity generates micro cavity resonance at any desired wavelength.

In yet another embodiment, the present invention is a polarized light source comprising (i) an OEL device including a cathode, an indium tin oxide anode and a mixture of a cholesteric liquid crystal material and an organic electroluminescent material, wherein the mixture is sandwiched between the cathode and the indium tin oxide anode layer or an OPL device including a mirror and a mixture of a cholesteric liquid crystal material and an organic photoluminescent material, and (ii) one or more glass substrates. The CLC materials in the composite may have a constant pitch, thereby producing narrowband polarized light, or a pitch distribution, thereby producing broadband polarized light. The polarized light source of this embodiment may further comprise a CLC polarizing layer at the output side of the device to improve the purity of the polarized light.

DETAILED DESCRIPTION OF NON-LIMITING EMBODIMENTS

As described above, the polarized light source of this invention includes an OEL or OPL device and a CLC polarizing layer. The use of an OEL or OPL device for the light source provides several advantages, such as high luminescent efficiency, low driving voltage, low electrical power consumption, long lifetime and simple device fabrication. The polarized light source of this invention may include any type of OEL or OPL device, which may further include materials of any type.

The use of a CLC polarizing layer provides further advantage in that it is non-absorptive. The use of a CLC polarizing layer is still further advantageous in that it is based on thin film technology, which enables the development of ultra-thin, lightweight polarized light sources. CLC polarizing layers and fabrication thereof are discussed in greater detail by Li et al., (in U.S. Pat. Nos. 5,691,789 and 6,034,753 which are fully incorporated by reference into this application). As used herein, CLC polarizing layers include a plurality of birefringent films disposed on one another. For the purposes of this disclosure, the following terms and definitions are used throughout. A CLC polarizing layer includes a stack, or plurality, of birefringent films that performs a predetermined optical polarizing function, for example reflecting right-hand circularly polarized light across a spectrum of wavelengths. A CLC polarizing device is a device that performs a predetermined optical polarizing function and includes one or more CLC polarizing layers.

Prior to discussing the function of the embodiments of this invention, a brief discussion of the polarization characteristics of CLC polarizing layers is in order. The CLC polarizing layers utilized in this invention reflect either right-hand or left-hand circularly polarized light in a predetermined range of wavelengths. Substantially all other light is transmitted. For example one CLC layer may reflect RH light in the red portion of the visible spectrum. Light at other wavelengths, whether LH or RH, is transmitted. The polarizing reflection bandwidth and position of the CLC polarizing layers depends on the molecular pitch distribution profile of the cholesteric liquid crystal (Li, et al., U.S. Pat. No. 5,691,789 and Li, et al., SID '96 Digest, p. 111 (1996)). The Li, et al., U.S. patent and article are fully incorporated herein by reference. Both the bandwidth and the center wavelength of a CLC polarizing device may be tuned over a wide wavelength range. The bandwidth may extend a few dozen to several thousand nanometers.

(1) A First Embodiment of the Present Invention

Figure 1A:
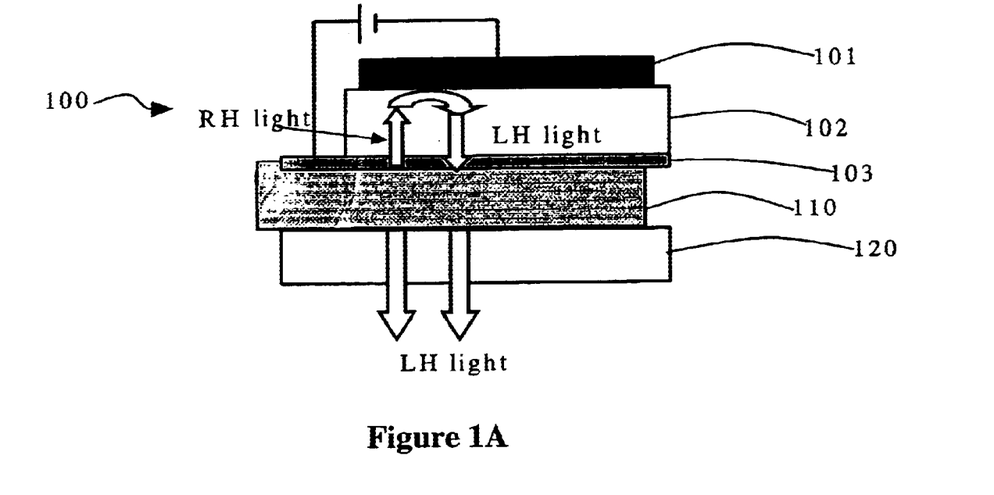
FIG. 1A is a schematic of the basic structure of a polarized light source utilizing a CLC polarizing device and an OEL device wherein the anode layer is deposited directly on the CLC polarizing layer.
Figure 1B:
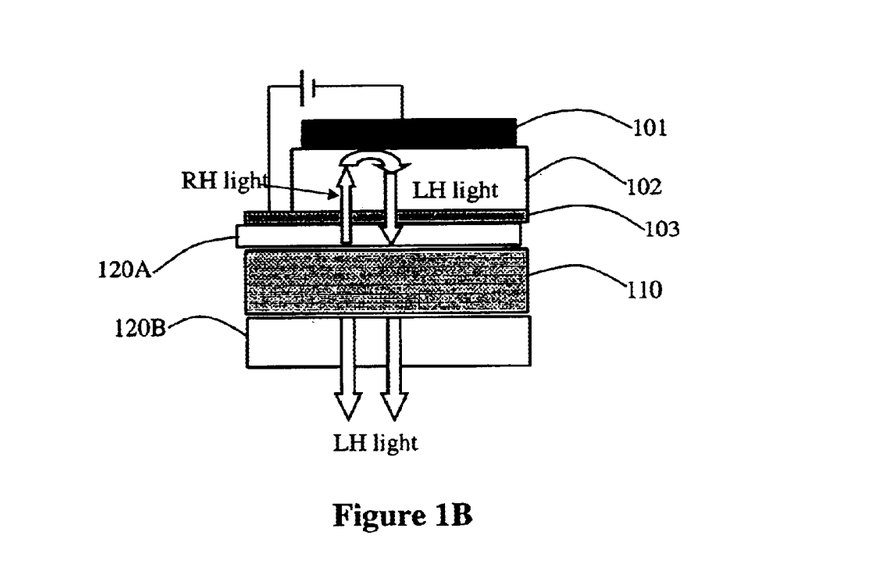
FIG. 1B is a schematic of the basic structure of a polarized light source utilizing a CLC polarizing device and an OEL device wherein the CLC polarizing layer is sandwiched between two glass substrates.

Referring to FIG. 1, a first embodiment includes an OEL device 100 superposed with a CLC polarizing device 110. The OEL device includes a metal cathode 101, an OEL material 102 and an anode layer 103. In the configuration shown in FIG. 1A, the anode layer 103, typically indium tin oxide, may be deposited directly upon the CLC polarizing layer 110, while in the configuration shown in FIG. 1B the CLC polarizing layer 110 is sandwiched between two glass substrates 120A, 120B, one of which 120A may be in direct contact with the anode layer 103 of the OEL device 100. The skilled artisan will recognize that substantially any transparent substrate may be used in place of the glass substrates. The device of FIG. 1B tends to be more easily fabricated than that of FIG. 1A, but the device of FIG. 1A tends to have a more compact profile. The fundamental operation of the two configurations is substantially identical and is as follows:

Unpolarized light is emitted from the OEL material 102. Unpolarized light may be thought of as equal parts RH light and LH light. For the purpose of this discussion it is assumed that the CLC polarizing layer 110 reflects RH light and transmits LH light. The skilled artisan will recognize that a CLC polarizing layer that reflects LH light and transmits RH light may also be used. In the example shown, at the CLC polarizing layer 110, substantially all LH light is transmitted, while RH light in the reflection bandwidth is reflected back into the OEL device 100. The remainder of the RH light (i.e., the RH light outside of the reflection bandwidth) is transmitted. The reflected RH light is reflected once again at the mirror-like metal cathode 101 where upon reflection it is changed to LH light. Substantially all of this LH light is then transmitted through the CLC polarizing layer and out of the device.

Figure 2:
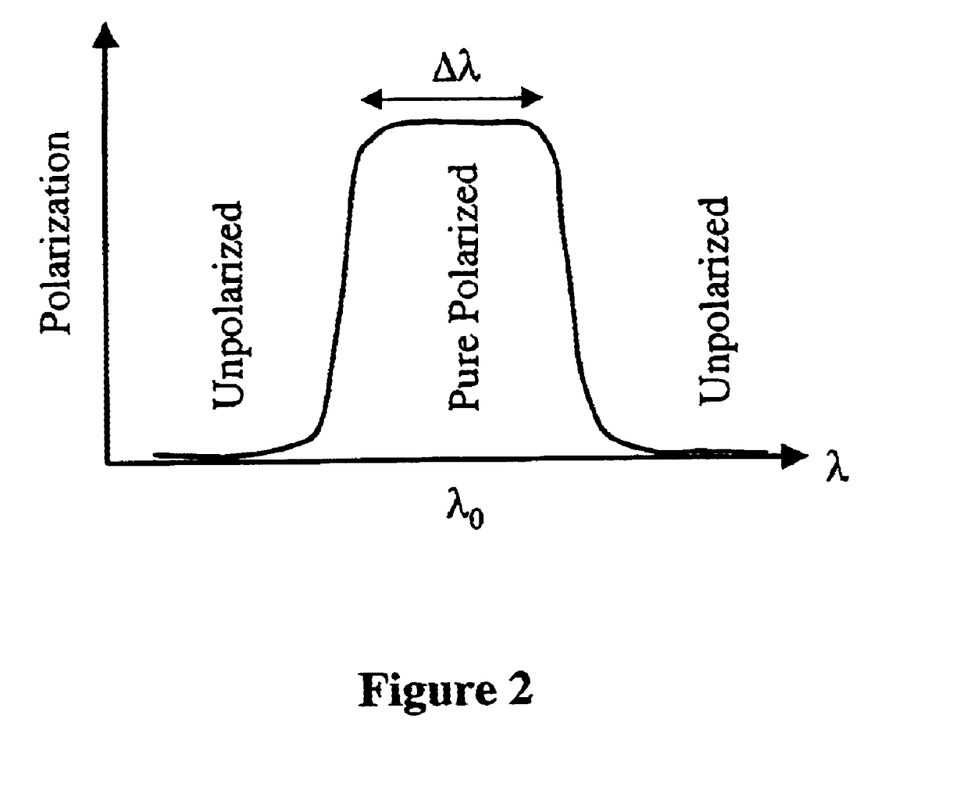
FIG. 2 is a graphical representation of the polarization properties as a function of wavelength for the first embodiment.

The output light from the device shown in FIG. 1 is substantially pure polarized light (LH in our example) within the bandwidth range of the CLC polarizing layer and unpolarized at other wavelengths. These polarization characteristics are illustrated in FIG. 2. If the bandwidth of the CLC polarizing layer covers the whole visible range and the OEL device 100 is able to emit a broad spectrum in the visible, the polarized light source of this embodiment may provide substantially pure polarized light in the visible. If the CLC bandwidth extends into the ultraviolet and/or infrared, polarized light may be provided in those regions as well. Or alternatively, a CLC polarizing layer with a narrow bandwidth may be chosen to provide polarized light only within in that narrowband.

Figure 3A:
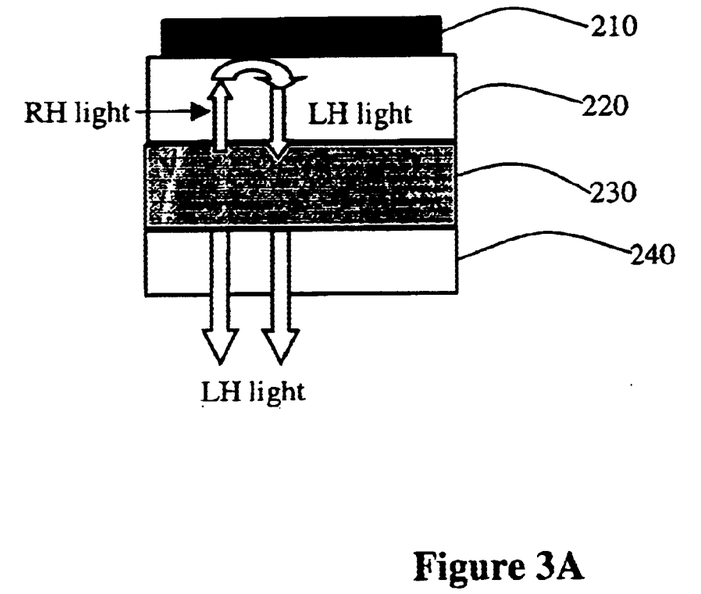
FIG. 3A is a schematic of the basic structure of a polarized light source using a CLC polarizing device and an OPL device wherein the OPL layer is in direct contact with the CLC polarizing layer.
Figure 3B:
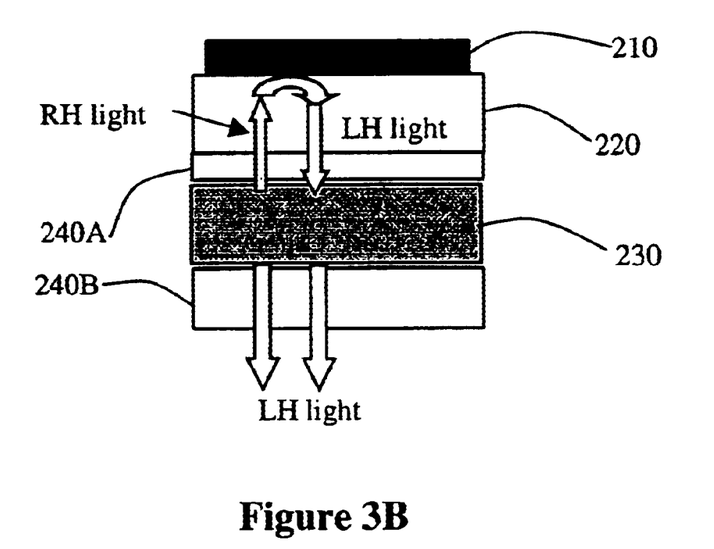
FIG. 3B is a schematic of the basic structure of a polarized light source using a CLC polarizing device an OPL device wherein the CLC polarizing layer is sandwiched between two glass substrates.

In another configuration of this embodiment, an OPL device may be used in place of the OEL device as shown in FIGS. 3A and 3B. In this configuration a mirror 210 (e.g., fabricated from metal) is positioned as a top substrate over the organic photoluminescent material 220. In the configuration shown in FIG. 3A, the OPL material may be deposited in direct contact with the CLC polarizing layer, while in the configuration shown in FIG. 3B, the CLC polarizing layer is sandwiched between two glass substrates 240A, 240B, of which one 240A may be in direct contact with the OPL material. The skilled artisan will recognize that substantially any transparent substrate may be used in place of the glass substrates. With the exception that light is produced via an optical pumping mechanism, rather than through the application of an electric field, the configurations of FIGS. 3A and 3B effectively function identically and produce light with substantially identical properties to those of FIGS. 1A and 1B. Again, the polarization properties of the emitted light is as shown in FIG. 2.

(2) A Second Embodiment of the Present Invention

Figure 4:
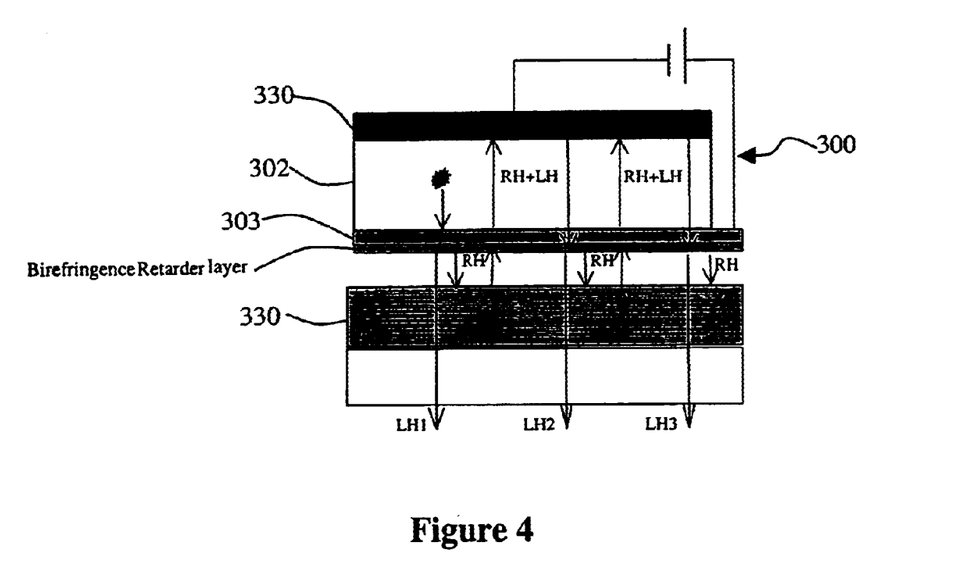
FIG. 4 is a schematic of the basic structure of a second embodiment of the invented polarized light source using a CLC polarizing device and an OEL device.

A second embodiment of this invention, as illustrated in FIG. 4, is effectively a micro cavity resonator, in which the CLC polarizing layer 330 functions as a polarizing half-mirror. In order to more easily describe the micro cavity effect (resonant light emission), the birefringent retarder 310 and the CLC polarizing layer 330 are shown having a separation 320 therebetween, in FIG. 4. In practice there does not need to be any separation between these two elements. For the purposes of this discussion, it is assumed that the CLC polarizing layer 330 reflects RH light and transmits LH light.

The embodiment illustrated in FIG. 4 functions as follows. Unpolarized, broadband light is emitted in the OEL material 302. After passing through a birefringent retarder 310, the LH portion of the light is transmitted through the CLC polarizing layer 330, and is labeled LH1, while the RH portion of the light is reflected back towards the retarder 310. The phase lag induced by the retarder 310 may be chosen such that light transmitted through it includes both LH and RH components. This light then reflects at the surface of the mirror-like metal cathode 301, whereupon the LH light becomes RH and the RH becomes LH owing to the half-wavelength shift upon reflection. After again passing through the birefringent retarder 310, the reflected light still includes both LH and RH components. Again, the LH light is transmitted through the CLC polarizing layer 330, and is labeled LH2, and the remaining RH light reflects back to the OEL device 300. As this process repeats, multiple reflections are established, allowing for multiple interference. Micro cavity resonance occurs when this interference is constructive.

In order to achieve micro cavity resonance, the micro cavity length must be an integer multiple of one half the wavelength of the desired wavelength of resonant light emission. The micro cavity length in FIG. 4 is defined as the optical path-length from the interface of the CLC polarizing layer 330 and the birefringent retarder 310 to the mirror like metal cathode 301. Those skilled in the art will recognize that the micro cavity length is dependent on both the geometric path-length and the index of refraction of the materials in the micro cavity.

Figure 5:
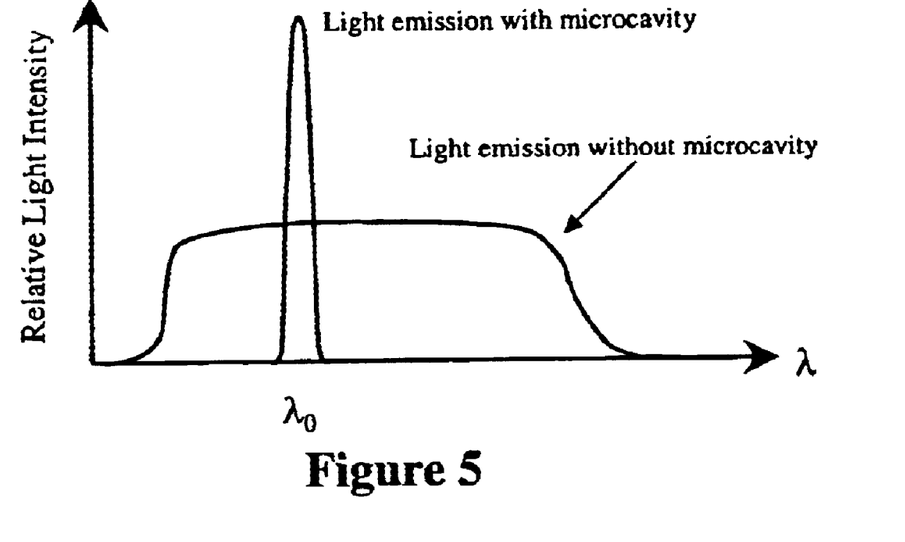
FIG. 5 is a graphical representation of emission spectra of organic electroluminescent devices with and without the microcavity effect.

Those skilled in the art will further recognize that a micro cavity structure inherently has a narrowband emission spectrum, allowing emission only at the resonance wavelength of the micro cavity. As described by Gruner et al., in J. Appl. Phys., 80, 207 (1996), a micro cavity enhances the emission at the resonant wavelength compared to the free-space emission of the luminescent material and suppresses emission at other wavelengths. This is illustrated in FIG. 5. Therefore, this embodiment produces LH, narrowband light. Similarly, a CLC polarizing layer that transmits RH light may be used to form a device that produces RH light. The wavelength of the emitted light may be tuned by changing the micro cavity length and reflection band of the CLC polarizing layer 330 to achieve different wavelength emissions. The micro cavity length may be easily changed by adjusting the birefringence value or the thickness of the birefringent retarder 310. Finally, the output light from a micro cavity resonator tends to be highly directional in nature (Nakayama, et al., in Applied Physics Letters, vol. 63, p. 594 (1993), and Rothberg et al., in SID 95 Digest p. 717 (1995)).

As described previously, the CLC polarizing layer 330 in this embodiment functions as a polarizing half-mirror. The micro cavity is built between the metal cathode 301 and the CLC polarizing layer 330 and, may include the birefringent layer 310. The conventional OEL device with a micro cavity is built with a mirror-like metal cathode and an inorganic multi-dielectric layer (see for example Miyata and Nalwa, "Organic Electroluminescent Materials and Devices, Gordon and Breach Science Publishers (1997)). The typical multi-dielectric layer has a narrow bandwidth, which may lead to fabrication difficulties because the center reflection wavelength of the multi-dielectric layer must be the same as the resonant wavelength of the micro cavity. This problem may be overcome by this embodiment of the present invention.

Figure 6:
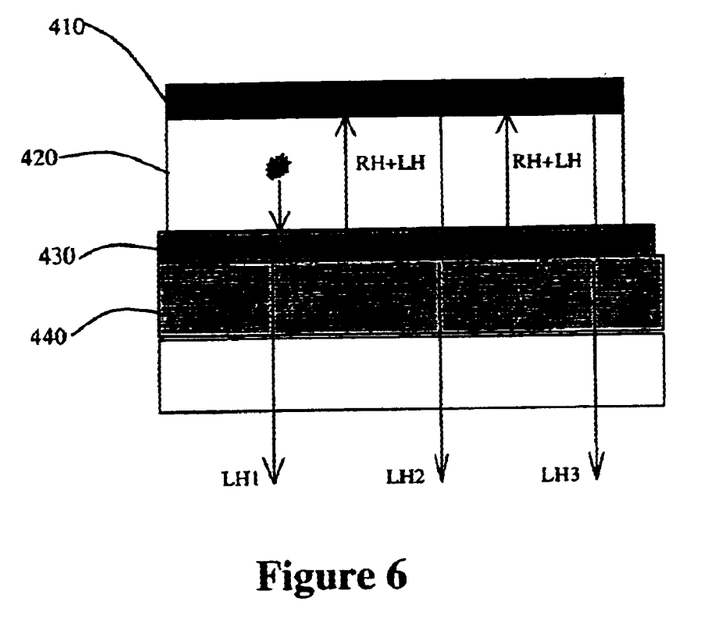
FIG. 6 is a schematic of the basic structure of a second embodiment of the invented polarized light source using a CLC polarizing device and an OPL device.

In another configuration of this embodiment, an OPL device may be used in place of the OEL device as shown in FIG. 6. In this configuration a metal mirror 410 is positioned as a top substrate over the organic photoluminescent material 420. With the exception that light is produced via an optical pumping mechanism, rather than through the application of an electric field, the configuration of FIG. 6 functions substantially identically and produces light with substantially identical properties to that of FIG. 4.

(3) A Third Embodiment of the Present Invention

Figure 7:
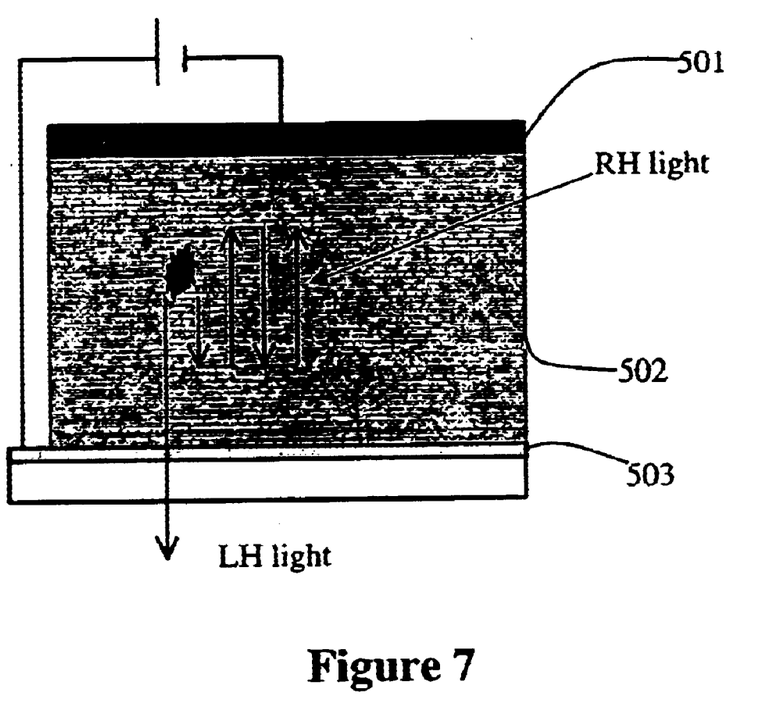
FIG. 7 is a schematic of the basic configuration of a polarized light source using mixed CLC and OEL materials.

In a third embodiment of the invented polarized light source, OEL or OPL materials may be directly mixed with CLC materials. One configuration of this embodiment, utilizing an OEL device 500, is illustrated in FIG. 7. In this embodiment, the OEL material is incorporated directly into the CLC, forming a material mixture 502 that conducts both holes and electrons. This type of material is referred to herein as "bipolar". There are several ways of achieving this bipolar mixture 502.

First, hole- or electron-transporting polymers may be mixed into the CLC materials. Some materials such as poly(para-phenylene vinylene) (PPV), poly(N-vinylcarbazole) (PVK), 2-(4-biphenyl)-5-(4-tert-butylphenyl)-1, 3,4-oxadiazole (PBD), 2,5-bis(5-tert-butyl-2-benzoxazolyl) thiophen (BBOT), triphenyldiamine (TPD), tris-(8-hydroxyquinoline) (ALQ), mixtures thereof, and the like may have hole- or electron-transporting properties and have been used to build single layer OEL devices (Miyata and Nalwa, "Organic Electroluminescent Materials and Devices," Gordon and Breach Science Publishers (1997)). The primary criteria for an appropriate composite material is that it must transport holes and electrons and the cholesteric liquid crystals must maintain helical alignment without distortion. By choosing appropriate material recipes, composite materials with good conductivity and alignment may be prepared.

Second, bipolar CLC or LC materials may be used directly. Work by Fan, et al., SPIE, vol. 3797, p. 170 (1999), indicates that some CLC materials transport holes and/or electrons. Using such CLC or LC materials, one may mix organic light-emitting materials to build CLC films.

Third, liquid crystalline light emitting polymers may be used. Lussem et al., in Liq. Cryst., vol. 21, p. 903 (1996) has identified a light-emitting liquid crystalline polymer that conducts electrons. The emission occurs in the wavelength range from about 375 nm to 575 nm. The material exhibits a smectic A-phase which may be frozen into the glassy state, maintaining the chiral structure needed to generate polarized light.

In the embodiment illustrated in FIG. 7, the CLC materials have a constant pitch and, therefore, have a narrowband reflection. For the purposes of this discussion it is assumed that the CLC materials reflect RH light. The skilled artisan will recognize that similar CLC materials reflecting LH light may be used. Unpolarized light is emitted from the OEL portion of the material mixture 502. Substantially all LH light, whether direct or reflected from the metal cathode 501, is transmitted through the CLC material and out of the device at the anode 503 side. RH light with wavelengths in the narrow reflection band defined by the CLC material undergoes multiple reflections off the CLC material, and is thereby trapped in the composite 502. The embodiment illustrated in FIG. 7, therefore, produces substantially pure LH light in the narrow bandwidth range and unpolarized light at other wavelengths (see FIG. 2). As described previously, the center wavelength of the polarization band may be adjusted by changing the CLC material recipe or processing method.

There may be some leakage of RH light associated with the configuration described above since light emitted close to the anode 502 may not be reflected. In order to achieve high purity LH light, it may be necessary to add a CLC polarizing layer on the output side of the anode 502 to reflect any escaping RH light in the bandwidth of interest.

Figure 8:
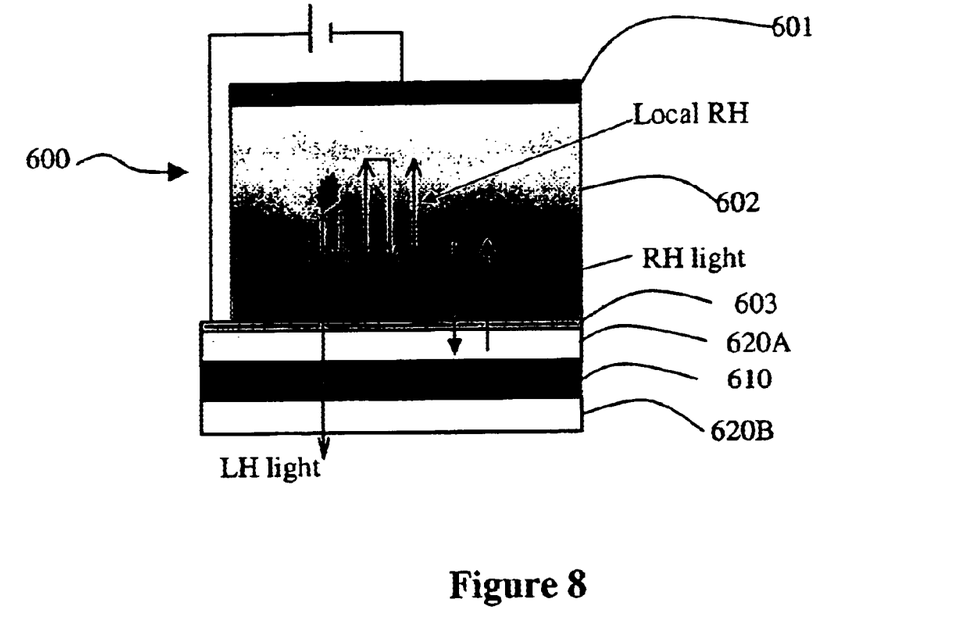
FIG. 8 is a schematic of the basic structure of a broadband polarized light source using mixed CLC and OEL materials.

FIG. 8 illustrates an alternative configuration of this embodiment, which produces broadband polarized light. As with the previous configuration, a material mixture 602 comprising OEL and CLC materials is prepared. However, in this configuration, the CLC material is prepared with a pitch distribution. The CLC reflection bandwidth may be tuned by changing the degree of pitch distribution. Unpolarized light is emitted from the OEL material. Substantially all LH light is transmitted out of the device. A portion of the RH light may be reflected at the metal cathode upon which it changes to LH light and is transmitted out of the device. A further portion of the RH light may be trapped in the material mixture if the wavelength is consistent with the local selectively reflective wavelength of the CLC material. Yet a further portion of the RH light may be trapped between the broadband CLC layer 610 at the output side of the anode 603 and a CLC layer in the material mixture 602, provided it has the appropriate pitch. The broadband CLC layer 610 functions like a wrapper, substantially preventing escape of RH light.

Figure 9:
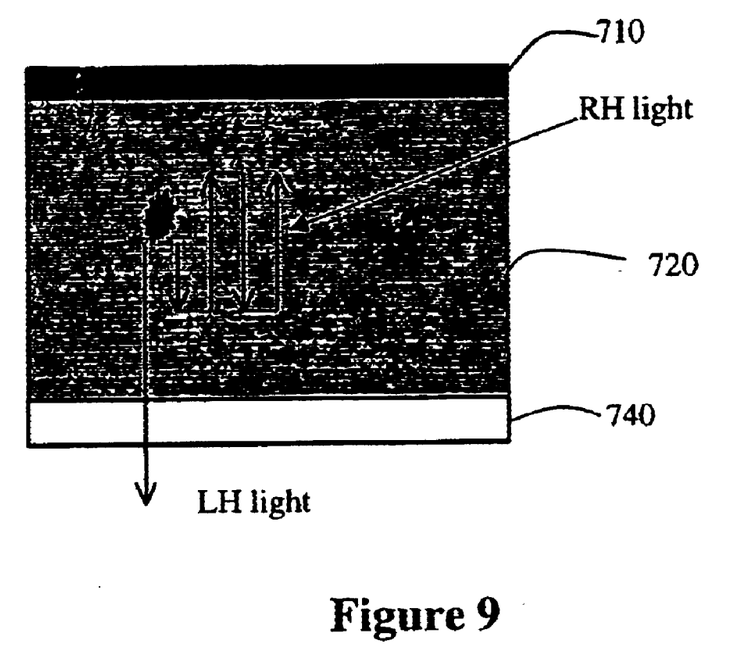
FIG. 9 is a schematic of the basic configuration of a polarized light source using mixed CLC and OPL materials.
Figure 10:
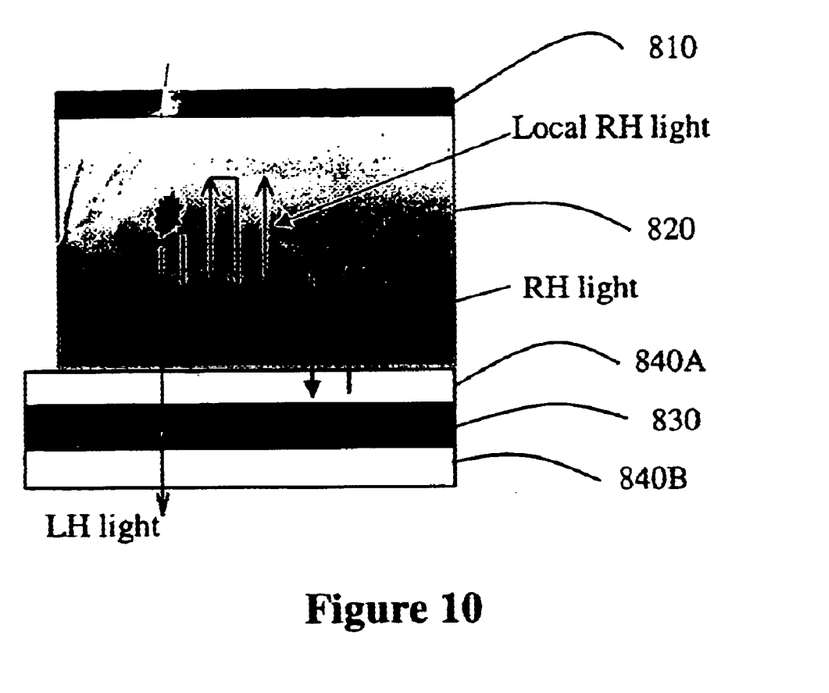
FIG. 10 is a schematic of the basic structure of a broadband polarized light source using mixed CLC and OPL materials.

In two additional configurations of this embodiment, an OPL material may be used in place of the OEL material as shown in FIGS. 9 and 10. In these configurations a mirror 710, 810 (such as fabricated from metal) is positioned as a top substrate over the material mixture 720, 820. Further, in these configurations, the material mixture may be disposed directly on a glass substrate 740, 840A. In the configuration illustrated in FIG. 10, a broadband CLC polarizing layer is sandwiched between two glass substrates 840A, 840B, of which one may be in direct contact with the material mixture. The skilled artisan will recognized that substantially any transparent material may be used in place of the glass substrates. A wider range of CLC and OPL materials may be used in the material mixture of these configurations since it not necessary for the material mixture to conduct holes and electrons. Again, with the exception that light is produced via an optical pumping mechanism, rather than through the application of an electric field, the configurations of FIGS. 9 and 10 function substantially identically and produce light with substantially identical properties to the configurations of FIGS. 7 and 8, respectively.

The embodiments described above are merely exemplary. It is understood that other modifications to the illustrative embodiments will readily occur to persons with ordinary skill in the art. All such modifications and variations are deemed to be within the scope and spirit of the present invention as defined by the accompanying claims.

What we claim is:

1. A polarized light source comprising:
   a cholesteric liquid crystal polarizing device; and
   an unpolarized light source, said unpolarized light source being a member of the group consisting of:
   an organic electroluminescent device including a cathode layer superposed with an organic electroluminescent material layer which is further superposed with an anode layer and
   an organic photoluminescent device including a mirror superposed with an organic photoluminescent material layer,
   wherein said organic electroluminescent device or said organic photoluminescent device is superposed with said cholesteric liquid crystal polarizing device.

2. The polarized light source of claim 1, wherein the unpolarized light comprises the organic electroluminescent device, further wherein said anode layer is an indium tin oxide layer.

3. The polarized light source of claim 1, wherein the unpolarized light comprises the organic electroluminescent device, further wherein said anode layer is disposed on said cholesteric liquid crystal polarizing device.

4. The polarized light source of claim 1, wherein the unpolarized light comprises the organic electroluminescent device, further wherein said cholesteric liquid crystal polarizing device is disposed on a transparent substrate.

5. The polarized light source of claim 4, wherein said anode layer is indium tin oxide and said transparent substrate is glass.

6. The polarized light source of claim 1, wherein the unpolarized light comprises the organic electroluminescent device, further wherein a transparent substrate is disposed between said organic electroluminescent device and said cholesteric liquid crystal polarizing device.

7. The polarized light source of claim 6, wherein said cholesteric liquid crystal polarizing device is disposed on another transparent substrate.

8. The polarized light source of claim 1, wherein the unpolarized light comprises the organic photoluminescent device, further wherein said photoluminescent material layer is disposed between said mirror and said cholesteric liquid crystal polarizing device.

9. The polarized light source of claim 8, wherein said cholesteric liquid crystal polarizing device is disposed on a transparent substrate.

10. The polarized light source of claim 1, wherein the unpolarized light comprises the organic photoluminescent device, further wherein a transparent substrate is disposed between said organic photoluminescent device and said cholesteric liquid crystal polarizing device.

11. The polarized light source of claim 10, wherein said cholesteric liquid crystal polarizing device is disposed on another transparent substrate.

12. The polarized light source of claim 1, wherein the unpolarized light comprises the organic electroluminescent device, further comprising a micro cavity from which micro cavity resonance may be achieved, said micro cavity having a micro cavity length.

13. The polarized light source of claim 12, further comprising a birefringent retarder layer, said birefringent retarder layer being disposed in said microcavity.

14. The polarized light source of claim 13, wherein said birefringent retarder layer is disposed between said organic electroluminescent device and said cholesteric liquid crystal polarizing device.

15. The polarized light source of claim 14, wherein said microcavity length is the optical path-length from said cathode, through said organic electroluminescent material, said anode layer and said birefringent retarder layer, to said cholesteric liquid crystal polarizing device.

16. The polarized light source of claim 14, wherein said cholesteric liquid crystal polarizing device is disposed on a transparent substrate.

17. The polarized light source of claim 16, wherein said anode layer is indium tin oxide and said transparent substrate is glass.

18. The polarized light source of claim 1, wherein the unpolarized light comprises the organic photoluminescent device, further comprising a microcavity from which microcavity resonance may be achieved, said microcavity having a microcavity length.

19. The polarized light source of claim 18, further comprising a birefringent retarder layer, said birefringent retarder layer disposed in said microcavity.

20. The polarized light source of claim 19, wherein said birefringent retarder layer is disposed between said organic photoluminescent device and said cholesteric liquid crystal polarizing device.

21. The polarized light source of claim 20, wherein said microcavity length is the optical path-length from said cathode, through said organic photoluminescent material and said birefringent retarder layer, to said cholesteric liquid crystal polarizing device.

22. The polarized light source of claim 20, wherein said cholesteric liquid crystal polarizing device is disposed on a transparent substrate.

23. A polarized light source comprising:
a member of the group consisting of
an organic electroluminescent device, said organic electroluminescent device including a mixture of a cholesteric liquid crystal material and an organic electroluminescent material, and
an organic photoluminescent device, said photoluminescent device including a mixture of a cholesteric liquid crystal material and an organic photoluminescent material,
wherein said organic electroluminescent device further includes a cathode and an anode layer,
further wherein said cholesteric liquid crystal material is further mixed with a conducting polymer, said conducting polymer being a member of the group comprising poly(para-phenylene vinylene); poly(N-vinylcarbazole); 2-(4-biphenyl)-5-(4-tert-butylphenlyl)-1,3,4-oxadiazole; 2,5-bis(5-tert-butyl-2-benzoxaolyl) thiophen; triphenyldismine; tris-(8-hydroxyquinoline); mixtures thereof, and the like.

24. A polarized light source comprising:
a member of the group consisting of
an organic electroluminescent device, said organic electroluminescent device including a mixture of a cholesteric liquid crystal material and an organic electroluminescent material, and
an organic photoluminescent device, said photoluminescent device including a mixture of a cholesteric liquid crystal material and an organic photoluminescent material,
wherein said organic electroluminescent device further includes a cathode and an anode layer,
further wherein said cholesteric liquid crystal material is bipolar.

25. A polarized light source comprising:
a member of the group consisting of
an organic electroluminescent device, said organic electroluminescent device including a mixture of a cholesteric liquid crystal material and an organic electroluminescent material, and
an organic photoluminescent device, said photoluminescent device including a mixture of a cholesteric liquid crystal material and an organic photoluminescent material,
wherein said organic electroluminescent device further includes a cathode and an anode layer,
further wherein said cholesteric liquid crystal material has a constant pitch.

26. The polarized light source of claim 25, further comprising a cholesteric liquid crystal polarizing device superposed with said organic electroluminescent device.

27. The polarized light source of claim 25, wherein said anode layer is disposed on a transparent substrate.

28. The polarized light source of claim 27, wherein said anode layer is indium tin oxide and said transparent substrate is glass.

29. The polarized light source of claim 27, said transparent substrate is disposed on a cholesteric liquid crystal polarizing device, said cholesteric liquid crystal polarizing device being disposed on another transparent substrate.

30. A polarized light source comprising:
   a member of the group consisting of
      an organic electroluminescent device, said organic electroluminescent device including a mixture of a cholesteric liquid crystal material and an organic electroluminescent material, and
      an organic photoluminescent device, said photoluminescent device including a mixture of a cholesteric liquid crystal material and an organic photoluminescent material,
   wherein said organic electroluminescent device further includes a cathode and an anode layer,
   further wherein said cholesteric liquid crystal material has a pitch distribution.

31. The polarized light source of claim 30, further comprising a broadband cholesteic liquid crystal polarizing device superposed with said organic electroluminescent device.

32. The polarized light source of claim 31, wherein said broadband cholesteric liquid crystal polarizing device is disposed between two transparent substrates, said anode layer being disposed on one of said transparent substrates.

33. A polarized light source comprising:
   a member of the group consisting of
      an organic electroluminescent device, said organic electroluminescent device including a mixture of a cholesteric liquid crystal material and an organic electroluminescent material, and
      an organic photoluminescent device, said photoluminescent device including a mixture of a cholesteric liquid crystal material and an organic photoluminescent material,
   wherein said organic electroluminescent device further includes a cathode and an anode layer,
   further wherein said organic photoluminescent device further comprises a mirror.

34. The polarized light source of claim 33 wherein said cholesteric liquid crystal material has a constant pitch.

35. The polarized light Source of claim 34, further comprising a cholesteric liquid crystal polarizing device superposed with said organic photoluminescent device.

36. The polarized light source of claim 34, wherein said organic photoluminescent device is disposed on a transparent substrate.

37. The polarized light source of claim 36, wherein said transparent substrate is disposed on a cholesteric liquid crystal polarizing device, said cholesteric liquid crystal polarizing device being disposed on another transparent substrate 46.

38. The polarized light source of claim 33, wherein said cholesteric liquid crystal material has a pitch distribution.

39. The polarized light source of claim 38, further comprising a broadband cholesteric liquid crystal polarizing device superposed with said organic photoluminescent device.

40. The polarized light source of claim 39, wherein said broadband cholesteric liquid crystal polarizing device is disposed between two transparent substrates, said organic photoluminescent device being disposed between the said substrates.

41. A method for fabricating a polarized light source, said method comprising:
   (a) providing an organic photoluminescent device as an unpolarized light source; and
   (b) superposing the unpolarized light source with a cholesteric liquid crystal polarizing device,
   wherein said organic photoluminescent device includes a mirror and an organic photoluminescent material.

42. A method for fabricating polarized light source, said method comprising:
   (a) providing an organic electroluminescent device as an unpolarized light source;
   (b) superposing the unpolarized light source with a cholesteric liquid crystal polarizing device, and
   (c) providing a microcavity, said microcavity including a birefringent retarder disposed therein,
   wherein said organic electroluminescent device includes cathode, an organic electroluminescent material and an indium tin oxide anode layer.

43. A method for fabricating a polarized light source, said method comprising: (a) preparing a material mixture, said material mixture including a cholesteric liquid crystal material and a member of the group consisting of an organic electroluminescent material and an organic photoluminescent material; and (b) incorporating said material mixture into a light source, said light source being a member of the group consisting of an organic electroluminescent device and an organic photoluminescent device, wherein said cholesteric liquid crystal material has a constant pitch or has a pitch distribution.

44. The method of claim 43, further comprising: (c) superposing said light source with a cholesteric liquid crystal polarizing device.

* * * * *